United States Patent

[11] 3,615,463

[72] Inventor William N. Kuschell
Burlington, Vt.
[21] Appl. No. 777,012
[22] Filed Nov. 19, 1968
[45] Patented Oct. 26, 1971
[73] Assignee International Business Machines Corporation
Armonk, N.Y.

[54] PROCESS OF PRODUCING AN ARRAY OF INTEGRATED CIRCUITS ON SEMICONDUCTOR SUBSTRATE
11 Claims, 5 Drawing Figs.

[52] U.S. Cl. .......... 96/36.2, 96/44, 117/5.5, 117/212, 29/574, 29/576, 29/577, 340/173 R
[51] Int. Cl. .......... G03c 5/04
[50] Field of Search .......... 96/36.2, 44; 117/212; 29/574, 576 V, 577

[56] References Cited
UNITED STATES PATENTS

| | | | |
|---|---|---|---|
| 3,245,794 | 4/1966 | Conley | 96/36.2 |
| 3,317,320 | 5/1967 | Reber | 96/36.2 |
| 3,385,702 | 5/1968 | Koehler | 96/44 |
| 3,508,209 | 4/1970 | Agusta et al. | 340/173 |

*Primary Examiner*—Murray Katz
*Attorneys*—Hanifin and Clark and Willis E. Higgins

ABSTRACT: Mask matching in semiconductor manufacturing processes wherein a plurality of masks are used for different processing steps to expose photoresist in arrays of patterns for semiconductor circuits on a wafer may be accomplished very rapidly on a sequential step basis. This may be done by selecting a mask for one of the process steps, then selecting masks one step at a time for the remaining steps by comparing the defect pattern in masks for the step being selected with the defect pattern of the masks previously selected, then selecting the mask for the step which will add the fewest number of additional defective integrated circuits in the array.

INVENTOR.
WILLIAM N. KUSCHEL
BY Willis E. Higgins
ATTORNEY

PROCESS OF PRODUCING AN ARRAY OF INTEGRATED CIRCUITS ON SEMICONDUCTOR SUBSTRATE

FIELD OF THE INVENTION

This invention relates to processes for producing integrated circuits, and to similar processes wherein an array of patterns is produced by a plurality of processing steps on a substrate. More particularly, it relates to an improved method of matching masks for reducing the number of defective integrated circuits or patterns in arrays produced by such processes.

CROSS REFERENCE TO RELATED APPLICATION

This application covers an improvement in the process disclosed and claimed in the copending and commonly assigned application of Arthur H. DePuy, Ser. No. 777,011, filed on the same day as the present application.

DESCRIPTION OF THE PRIOR ART

Processes for producing an array of patterns, such as integrated circuits, on a substrate, such as a semiconductor wafer, using a plurality of masks having an array of patterns in a series of processing steps, are well known. Agusta et al., application Ser. No. 539,210, now U.S. Pat. No. 3,508,209, filed Mar. 31, 1966, entitled "Monolithic Integrated Structure Including Fabrication and Package Therefor," assigned to the same assignee as the present application, discloses such a process. In such processes, a semiconductor wafer having an oxidized surface or other substrate is coated with photoresist, the photoresist is exposed through a mask having an array of patterns, the exposed photoresist is developed, and a pattern is etched to remove oxide in the wafer on those areas where the photoresist is not exposed. An impurity may then be diffused into the unoxidized semiconductor material exposed by the etching step. The process disclosed in the Agusta et al. application is used to produce an array of highly complex, closely spaced, integrated circuits on a semiconductor wafer.

In the production of such patterns on a substrate in this manner, defects in the masks are reproduced on the substrate. Such defects occur in a random fashion on the masks. These defects may be scratches on the masks, photoresist that was not removed in fabrication of the mask itself, areas of the mask where photoresist was removed where it should not have been removed, or other imperfections.

Even if most of the patterns in the array on each mask do not contain a defect, randomly occurring defects will produce defective patterns in most of the array if seven or eight masking steps are used to produce the array of patterns. For example, if 80 percent of the patterns in the array on each mask are defect free, randomly occurring defects on the patterns in the masks will reduce the maximum possible yield of patterns containing no defects obtained by using such masks in a process that requires eight different masking operations to about 17 percent. This yield figure assumes that no additional defects in the patterns will be produced by any other cause than defects in the masks. With an increased number of different masking steps, the maximum possible yield decreases exponentially. Semiconductor manufacturing processes involving, for example, 25 different masking steps therefore cannot be carried out on a practical basis unless something is done to reduce the number of defective integrated circuits produced by these randomly occurring mask defects.

U.S. Pat. No. 3,317,320, issued May 2, 1967, discloses one proposed solution for the problem of random mask defects. In the process there disclosed, two different masks having the same predetermined pattern are employed for each masking step required, either with or without the application of an additional layer of photoresist between the application of the two masks. While the array of predetermined patterns is the same on these two masks, the random distribution of defects is different.

This process reduces the effect of random mask defects, but it doubles the number of masking operations that must be carried out in a semiconductor manufacturing process which employs it. Additionally, the second mask having the same array of predetermined patterns must be registered very precisely in alignment with the image produced by the first mask.

Another proposed solution for the problem of random mask defects is touching up the masks themselves to correct them, as disclosed in commonly assigned U.S. Pat. No. 3,385,702 to Koehler, issued May 28, 1968. This approach, although very useful with some masks, is difficult to carry out when the patterns are very small and closely spaced, as in the case of present day monolithic integrated circuits on semiconductor wafers.

Another possible approach to the problem of random mask defects is to use higher quality masks. However, masks having even 20 percent of the integrated circuits in their arrays containing defects are very difficult to make, even with the very best mask fabrication technology. With the present state of mask fabrication technology, this approach is not practical.

A further problem in the prior art is the fact that a great deal of difficulty has been encountered in determining whether an apparent mask defect will in fact cause a defective integrated circuit at the array position containing the defect. Defective integrated circuits are often produced by mask defects which appear to be so slight as to cause no problem. Nondefective integrated circuits are at times produced at array positions containing apparently serious mask defects. Therefore, a manufacturing process which can maintain identification of mask locations in the array is needed. This information and the yield of nondefective integrated circuits from array locations containing possible defects in one or more of the masks would be very valuable in determining proper criteria for classifying particular circuit patterns on the masks as defective in fact. A related use of this information would be to determine whether defective circuits in an array are caused by mask defects or by the manufacturing process itself.

Thus, a serious problem exists in reducing the effect of randomly occurring mask defects on integrated circuit yields in processes requiring a plurality of masking steps. Further, a serious problem exists in the lack of ability to characterize accurately given integrated circuit patterns on masks as in fact defective.

SUMMARY OF THE INVENTION

The technique of mask matching may be used to overcome these problems in the prior art. The present invention is an improvement in the mask matching process disclosed and claimed in the above-mentioned DePuy application. In the disclosed DePuy process, masks used for different processing steps to expose photoresist in arrays of patterns for semiconductor circuits on a wafer are matched by combining one mask for each processing step in all possible combinations, then selecting the combination for use which will minimize the number of defective integrated circuits in the array. The DePuy process enables a very marked improvement in semiconductor process yield to be obtained.

In the case of semiconductor manufacturing processes involving many different masking steps and large inventories of masks for each masking step, making all of the possible combinations of one mask from each masking step, in accordance with the specific embodiment disclosed in the DePuy application, is somewhat time consuming. The number of possible combinations of one mask from each masking step can be expressed by the relationship $N^n$, where N is the number of masks for each masking step and n is the number of masking steps in the process. Even with the use of a high speed computer, the task of comparing masks for seven or eight process steps, with each process step having an inventory of 15 to 20 masks, takes a large amount of time.

In practice, carrying out a semiconductor manufacturing process on a lot of wafers in which seven or eight different masking steps are used is carried out over a considerable period of time. It may take several months for a particular semiconductor wafer lot to pass through the whole manufacturing process. If an entire set of matched masks is selected before the manufacturing process begins, as is required in a mask matching process in which one mask from each level is combined in all possible combinations, the matched sets are often removed from the mask inventory for several months. Also, setting aside the whole set of masks in advance means that additional masks fabricated during the time that a lot of wafers is being processed cannot be employed in obtaining the matched set for those wafers.

Accordingly, it is an object of this invention to reduce the number of comparisons required to match masks in the fabrication of patterns on a substrate using a plurality of masking steps.

It is a further object of the invention to increase the inventory of masks that may be compared on a practical basis in a mask matching process.

It is another object of the invention to eliminate the necessity of setting an entire matched set of masks aside for use in an integrated circuit manufacturing run before the run begins.

It is yet another object of the invention to enable masks for later process steps in an integrated circuit manufacturing run fabricated after the run has begun to be used in mask matching for the run.

These and other related objects may be obtained by employing the sequential mask matching process herein disclosed. The invention is an improvement in a process for overlying defects in masks of different levels for successive processing steps used to produce an array of patterns on a substrate, herein called a mask matching process. To carry out the invention, a mask for a first one of the successive processing steps, herein called a first level mask, is selected. Masks from a second level need only be compared with the first level mask chosen A combination of the first level mask and a second level mask which maximizes the number of defect-free patterns in the array produced by the first and second level masks may then be selected. The process may be continued by comparing masks from a third level with the location of defects in the combination of the first and second level masks chosen. A third level mask may then be selected to maximize the number of defect-free positions in the combination of first, second and third level masks. The process may be continued for additional levels by comparing the location of defects in masks for the remaining levels with the location of defects in masks for the levels already chosen. Masks for the remaining levels are then selected to maximize the number of defect-free positions in the combination of masks selected.

Use of the present sequential mask matching process reduces the number of comparisons required to match masks drastically, yet obtains most of the improvement in yield of defect-free patterns in an array that may be obtained by making all possible combinations of the masks for each level. In the present process, only N $(n-1)$ comparisons are required to match masks, wherein N is the number of masks at each level in the process, and n is the number of levels in the process, as compared to the $N^n$ comparisons required if all possible combinations of the masks are made. In most processes for producing an array of patterns on a substrate, the number of masks at each level from which the comparisons are made may be increased substantially, yet still require only a small fraction of the comparisons necessary if all possible combinations of one mask from each level are made.

For many processes in which matched masks are desired, the defect locations in the individual masks may be recorded on cards. When a first level mask is chosen, its defect locations are indicated on the card. The defect locations in the second level masks are compared with the recorded pattern on the card to determine which second level mask will produce the fewest number of additional defective integrated circuits. The combined defect pattern of the first and second masks selected are then indicated on the card, and the defects in the third level masks are compared against this combined defect pattern. As an alternative to the use of cards to make the comparisons and selection of the matched masks, a computer may be used.

The process of this invention is particularly suited for mask matching in the manufacture of an array of integrated circuit devices on a semiconductor wafer. Such integrated circuit manufacturing processes are so lengthy that setting an entire matched set of masks aside for use in each manufacturing run ties up a large number of masks, since many runs are going on at the same time in various stages of completion. Also, the ability to select masks as they are needed for each processing step enables better quality masks to be used immediately for the remaining processing steps in a run. The reduction in the total number of defective patterns in an array produced using a plurality of masking steps makes the present improved mask matching process suitable for use in essentially any process requiring successive masking steps to produce an array of patterns on essentially any substrate.

The foregoing and other objects, features, and advantages of the invention will be apparent from the following more particular description of the preferred embodiments of the invention, as illustrated in the accompanying drawings.

DESCRIPTION OF THE PREFERRED EMBODIMENTS

Figure 1:
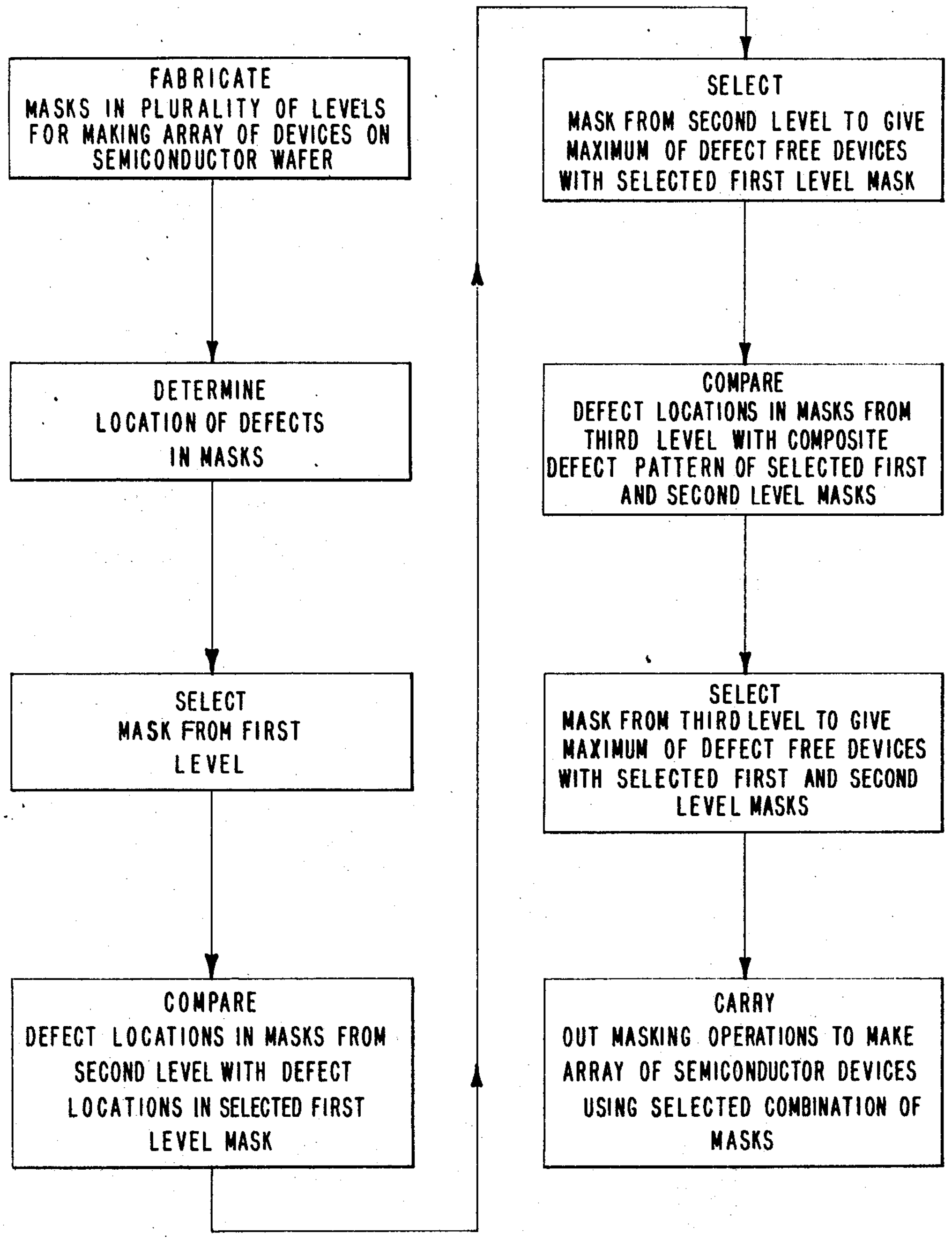
FIG. 1 is a flow diagram of the claimed process.

Referring now to the drawings, more particularly to FIG. 1 there is shown a flow diagram of a sequential mask matching process, showing its basic steps. The first step is to fabricate masks in a plurality of levels for making an array of patterns on a substrate, such as integrated circuit devices on a semiconductor wafer. A number of masks for each level in the process are fabricated, so that a choice may be made of a particular mask to use in a given level. Reference is made to the above cited copending Agusta et al. application Ser. No. 539,210, FIGS. 8–17 thereof, for examples of such masks. The masks there shown depict only one pattern in the array. The actual mask itself consists of an array containing a large number of the patterns shown.

As indicated in the application, the mask patterns shown are greatly enlarged. Fabrication of an array of these patterns in very small size (e.g., about 0.06 inch by 0.06 inch each) is extremely difficult. In the fabrication of an array of such patterns, random defects occur which make the pattern defective where they occur. Consequently, semiconductor devices produced using the defective member of the array are themselves defective. The next step in the process is to determine the location of these random defects in the pattern areas on the masks fabricated in step one. This is usually done by visual inspection of the masks.

Once the location of the defects is known for the masks in each level, a mask may be selected from a first level. This first level need not necessarily correspond to the first masking step in the semiconductor manufacturing process. However, if it is desired to select the masks for each step in the process as they are needed, this level should correspond to the first masking step in the manufacturing process.

The next step in the claimed process is to compare the defect locations in masks from a second level with the defect locations in the selected first level mask. Again, this second level need not correspond to the second masking step in the semiconductor manufacturing process. However, if it does, the defect locations of the second level masks need not be compared with those of the first level mask until after the first level mask has actually been used in the manufacturing process.

Based on the comparison of defect locations in the second level masks with the defect locations in the selected first level mask, a second level mask is selected to give a maximum of defect-free devices in the array when used in combination with the selected first level mask. The result of this selection is to overlay the random defects produced by the second level mask as far as possible with the random defects produced by the first level mask.

In a similar manner, the defect locations in masks from a third level are compared with the composite defect pattern of the selected first and second level masks. Again, if this third level corresponds to the third masking step in the manufacturing process, this comparison need not be made until after the first and second level masks have actually been used in the semiconductor manufacturing process.

As above, a mask from the third level is selected to give a maximum of defect-free devices when used with the selected first and second level masks in the semiconductor manufacturing process. Masks from additional levels may be compared against the composite defect pattern of the previously selected masks for additional levels in the same manner.

The final step in the process is to use the selected combination of masks for masking operations in the fabrication of an array of semiconductor devices. The entire combination of masks may be selected before any of the masks are used, or each mask may be used in its corresponding masking step as soon as it is selected. Matching the masks sequentially in this way to overlay defects as far as possible simplifies the mask matching process greatly, without substantial sacrifice in the increased number of defect-free semiconductor devices obtained through mask matching.

Figure 2:
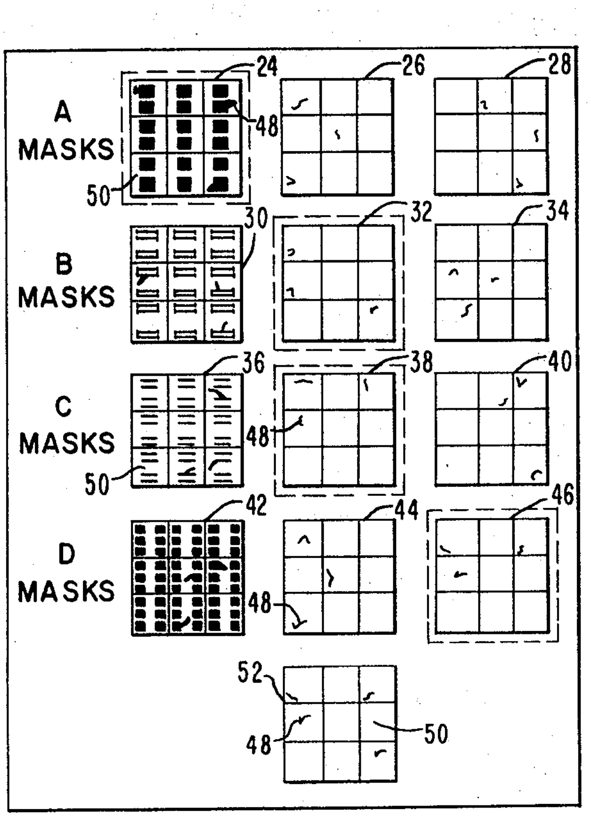
FIG. 2 shows masks containing random defects which may be matched in accordance with the invention.

FIG. 2 of the drawings shows 12 masks from which four masks are to be selected in accordance with the invention. There are three A level masks 24, 26 and 28; three B level masks 30, 32, and 34; three C level masks 36, 38, and 40; and three D level masks 42, 44, and 46. Each of these masks contain three random defects 48 in their nine patterns and six nondefective pattern areas 50.

Figure 3:
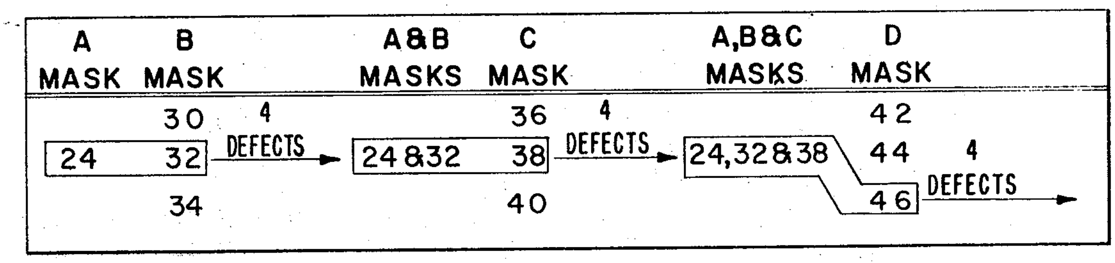
FIG. 3 depicts the selection of a combination of the masks shown in FIG. 2 in accordance with the invention.

FIG. 3 shows how the sequential mask selection is made. As indicated, A mask 24 is selected. In this example, this has been done on an arbitrary basis. In actual practice, the best A level mask available for use in the mask inventory is usually selected. As shown, A mask 24 contributes three defective integrated circuits to the array. The defect pattern of each of the B masks 30, 32, and 34 is compared with the defect pattern of A mask 24 to see how many additional integrated circuits containing defects 48 would be produced. If B mask 30 were used with A mask 24, a total of five integrated circuits containing defects 48 would be produced. With B mask 32, four defects would be produced. With B mask 34, six defects would be produced. B mask 32 is therefore selected for use with A mask 24. Similarly, the use of C mask 38 with the combination of A mask 24 and B mask 32 adds no additional defects, while the use of the other two C masks 36 or 40 would produce one additional defect. C mask 38 is therefore selected for use. On the same basis, D mask 46 is selected for use with the combination of A mask 24, B mask 32, and C mask 38. These four masks give composite defect pattern 52 shown in FIG. 2, containing four defects 48 and five nondefective pattern areas 50.

As indicated in FIG. 3, a total of nine different comparisons was required to select one mask from each of the four levels on a sequential basis. If all possible combinations of one mask from each level had been used, a total of $3^4$ or 81 different comparisons would have been required.

CARD EMBODIMENT

Figure 4:
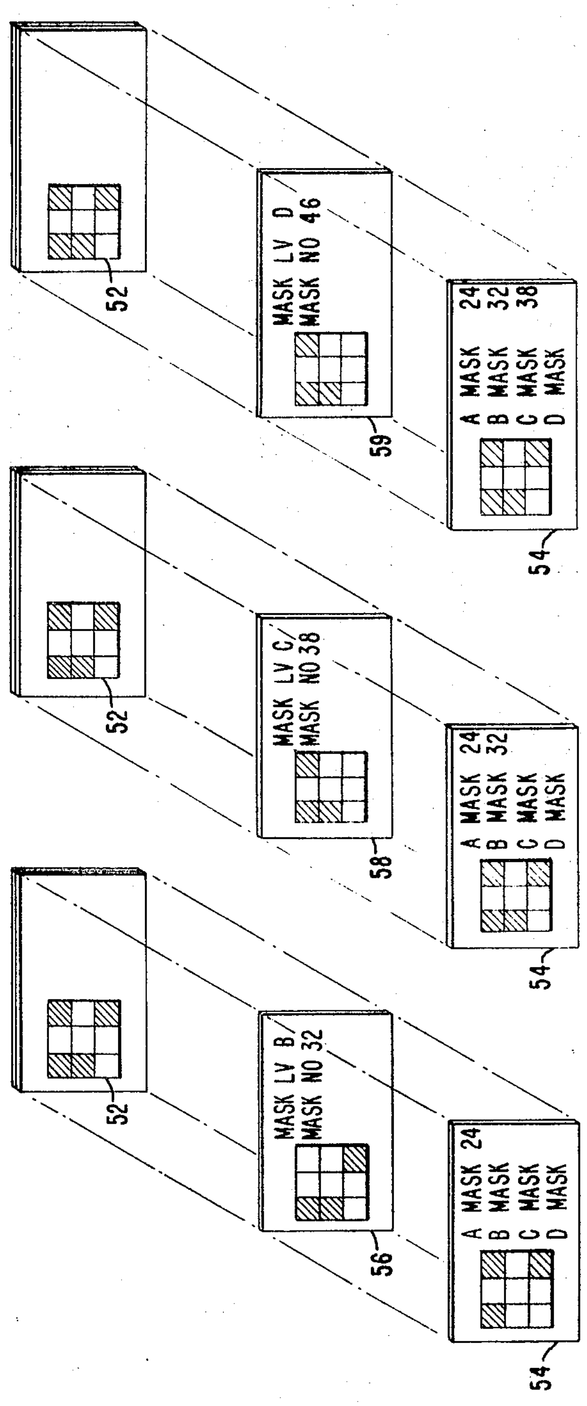
FIG. 4 shows the use of clear plastic cards to make a sequential mask selection.

FIG. 4 shows how clear plastic cards with the defect pattern for the masks indicated on them may be used to carry out the sequential mask matching process. As shown in the first column, plastic card 54 initially has the array locations containing defects 48 in A level mask 24 marked out. Plastic card 56 shows the locations containing defects 48 in B level mask 32. The cards 54 and 56 are laid one on top of the other to give a composite defect pattern 52 for these two masks. Other plastic cards showing the defect locations in B level masks 30 and 34 are substituted for the card 56 shown to give the composite defect pattern for them in combination with A mask 24. Since B mask 32 adds the fewest number of additional defective locations when used with A mask 24, B mask 32 is selected for use and the additional defect it contributes is marked out on card 54, as shown in the second column of FIG. 4. Card 54 and one of cards 58 showing the defect locations in C masks 36, 38, and 40 are overlaid to obtain a composite defect pattern 52 for the A, B, and C masks. Since C mask 38 adds no additional defective locations, it is selected for use and its number is written on card 54. D mask 46, having its defect locations marked out on card 59, is selected for use in the same manner.

The comparison of the composite defect patterns 52 for each combination of a particular level mask and those masks which have been used previously may be made visually. Alternatively, if the array locations on each mask containing defects 48 are marked out completely, the comparison may be made through use of a suitable photodector to measure the amount of light transmitted through nondefective pattern areas 50 in composite 52.

In most instances, each mask level will contain more than three masks from which a selection may be made. Since the sequential mask matching method reduces the number of comparisons that need be made very drastically, much larger mask inventories than used in this example may be matched using the card embodiment without difficulty.

COMPUTER EMBODIMENT

The use of a computer enables the sequential mask matching process to be carried out very rapidly and conveniently. To use a computer for this purpose, the defect location information resulting from an inspection of the masks for each process level is stored in a computer memory. Through use of any suitable program, a first level mask is selected for use from the available inventory, as stored in the computer memory. The defect locations of second level masks are compared with those of the first level mask selected, and the second level mask adding the fewest additional defective locations selected. The comparison and selection continues for additional mask levels, with the comparisons in each case being made against the composite defect pattern of the masks already selected. When any particular mask is selected from the inventory stored in the computer memory for use, that mask is withdrawn from the available inventory.

In the computer, a location in a mask containing a defect is indicated by a "1" and a defect-free location is indicated by a "0." Through suitable logic operations carried out in the computer, the defect-containing locations in the masks may be compared and the optimum combinations selected.

In practice, the computer is preferably requested to list the best A mask available in its inventory at the time the request is made. That mask is then withdrawn from the inventory and used for the initial masking step in the manufacture of an array of semiconductor devices. When the manufacturing process has reached the second masking step, the computer is requested to compare the defect pattern of all the B level masks available in its inventory against the defect pattern for the particular A level mask used. On the basis of this comparison, the computer selects the B level mask for use which will add the fewest number of additional defects to those obtained with the A mask used. This B level mask is then selected from the inventory for use, and the computer records the combined defect pattern thus produced.

When the computer is requested to choose a C level mask for use, it compares the defect patterns for the C level masks available in its inventory against the recorded defect pattern for the composite of the A and B masks used. The C level mask chosen is withdrawn from the inventory until completion of its use.

This same type of comparison, selection, and withdrawal is used by the computer for each successive mask level. The use of a computer to carry out the sequential mask matching process enables a large number of manufacturing runs to be carried out simultaneously and allows sequential mask selection to be made from a large inventory of masks for each level very rapidly.

The following examples illustrate the improvement in nondefective chip positions that can be obtained through use of the sequential mask selection process over that obtained with no attempt to match mask defects.

EXAMPLE I

Data for masks containing an average of 10 percent of random defects in an array of 49 integrated circuits produced by seven different masking steps was used to obtain mask combinations in a sequential mask matching process, through use of a suitably programmed IBM 7090 computer. The data was for 20 masks at the first or A level, 30 masks for the second or B level, 40 C level masks, 50 D level masks, 60 E level masks, 70 F level masks, and 80 G level masks.

The computer was instructed to choose the best A level mask from the available 20 in the data, then choose the B mask from the available 30 in the data which would add the fewest number of additional defective integrated circuits in combination with the A mask selected. The computer then compared the masks for the remaining levels, one level at a time, against the combined defect pattern of the masks already selected, until the selection of masks for levels A through G was complete. After the selection of the first mask combination was completed, the computer was instructed to remove these masks from the available inventory and then obtain a second best mask combination from the inventory. These masks were removed from the inventory and the selection repeated to obtain a third combination. The selection was continued until five sequentially selected mask combinations were chosen from the inventory.

To show the improvement in defect-free positions obtained through use of sequential mask matching, the yield of defect-free array locations that would be obtained through random selection of one mask from each level from the masks for each level, with no attempt to match defect containing positions in the array was calculated from the formula:

$y=(1-d)^n$, in which $Y$ is the yield of defect-free array positions, $d$ is the average incidence of defect in the masks being used, and $n$ is the number of mask levels.

Thus, with an average of 10 percent, or 0.1 of the array locations defective, the yield is $y=(1-0.1)^7$ $$Y=0.478$$

$$Y=47.8 \text{ percent}$$

The results obtained for matched masks containing an average of 10 percent of randon defects in their arrays is given in table I below, together with the yield of defect-free devices that would be obtained with a random selection of masks.

TABLE I

| | Yield-Matched Sets | | Yield-Random Use of Masks, |
|---|---|---|---|
| Combination Selected | No. of Defects | % of array defect-free | % of array defect-free |
| 1 | 10 | 79.5% | 47.8% |
| 2 | 11 | 77.5% | 47.8% |
| 3 | 10 | 79.5% | 47.8% |
| 4 | 12 | 75.5% | 47.8% |
| 5 | 10 | 79.5% | 47.8% |

Example II

The procedure of the above example was repeated, but with the use of data for masks containing an average of 20 percent of random defects in their arrays. The results obtained are shown below in table II.

TABLE II

| | Yield-Matched Sets | | Yield-Random Use of Masks, |
|---|---|---|---|
| Combination Selected | No. of Defects | % of array defect-free | % of array defect-free |
| 1 | 21 | 57.2% | 21.0% |
| 2 | 23 | 53.0% | 21.0% |
| 3 | 19 | 61.2% | 21.0% |
| 4 | 24 | 51.0% | 21.0% |
| 5 | 27 | 44.9% | 21.0% |

EXAMPLE III

The procedure of the above two examples was repeated, but with the use of data for masks containing an average of 30 percent of random defects in their arrays. The results obtained are shown below in Table III.

TABLE III

| | Yield-Matched Sets | | Yield-Random Use of Masks, |
|---|---|---|---|
| Combination Selected | No. of Defects | % of array defect-free | % of array defect-free |
| 1 | 29 | 40.8% | 8.5% |
| 2 | 32 | 34.7% | 8.5% |
| 3 | 32 | 34.7% | 8.5% |
| 4 | 32 | 34.7 | 8.5% |
| 5 | 34 | 30.6% | 8.5% |

Most of the improved yield obtained by mask matching in which all possible combinations of the masks are made may be obtained if the masks are matched sequentially. By matching the masks sequentially, the total number of comparisons required to select one matched set was reduced comparisons required this case from millions of possible mask combinations, to 330 comparisons, with the sequential mask matching method.

USE OF SELECTED MASKS

Figure 5:
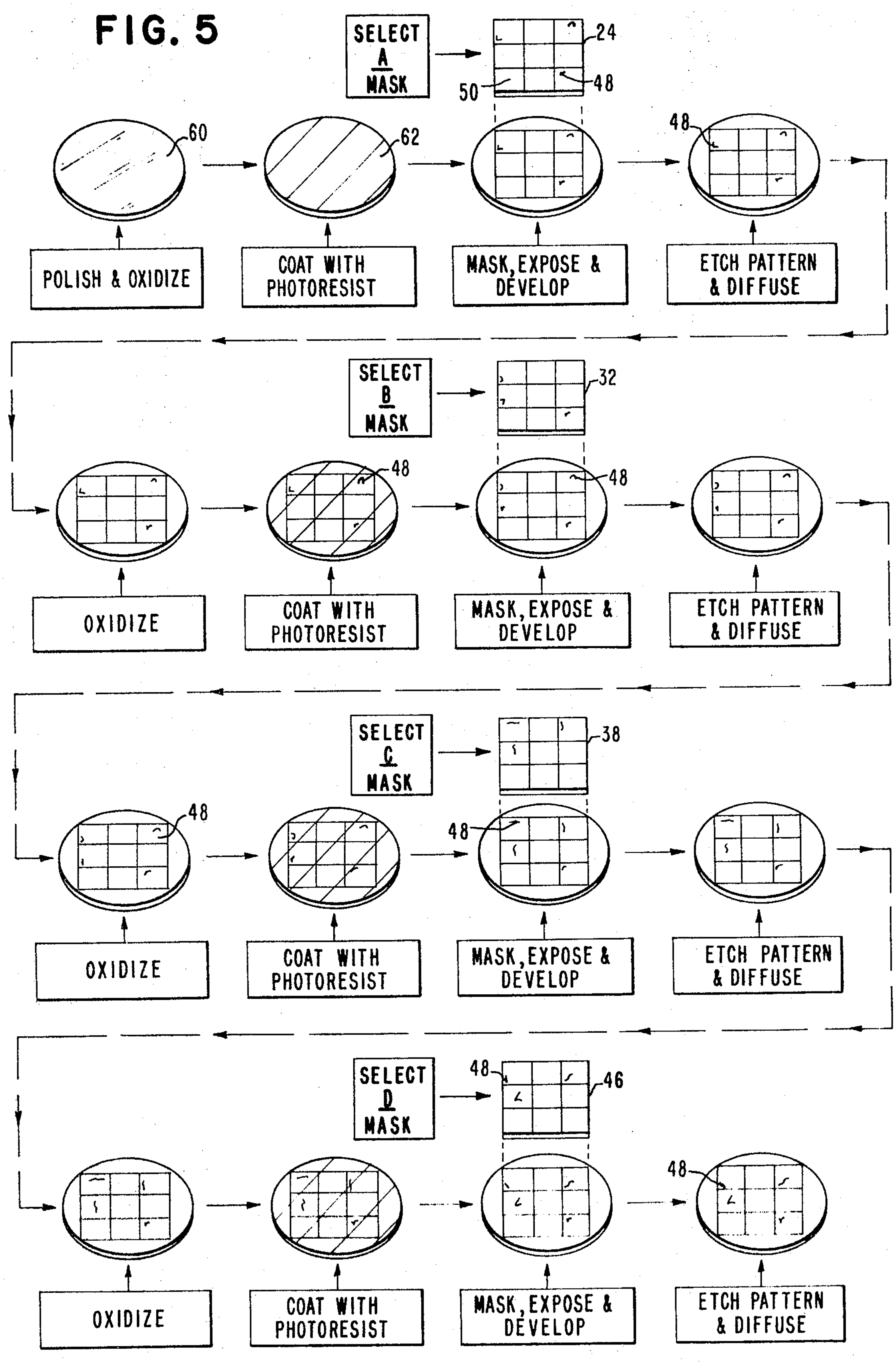
FIG. 5 shows the use of sequentially selected masks to produce an array of semiconductor devices on a wafer.

FIG. 5 shows how the masks selected by the sequential mask matching process are used to make semiconductor devices on a wafer 60 of silicon or other semiconductor material. The wafer 60 is first polished to a smooth surface, then oxidized. The oxidized wafer is then coated with a layer of photoresist 62. An A level mask, in this case A mask 24, containing a first pattern desired to be reproduced in the photoresist 62 is aligned on the surface of the photoresist-coated wafer. The photoresist is exposed to suitable light through the mask, then the photoresist is developed to remove either the exposed or unexposed areas, depending on whether a negative or positive photoresist is used. An etching operation is then carried out on the wafer 60. The photoresist 62 remaining on the surface of the wafer after the developing step prevents etching from taking place on the areas of the wafer covered by it. Defects 48 in the mask 24, as well as the desired pattern, are reproduced in the photoresist 62.

The etching operation removes the oxide layer from the wafer 60 in the areas not covered by photoresist 62 to expose elemental silicon. An impurity, such as boron, arsenic or phosphorus, may now be diffused into the elemental silicon to change its electrical conductivity characteristics.

As shown in FIG. 5, the oxidation, photoresist coating, mask selection, masking, exposing, developing, etching, and diffusion steps are repeated utilizing B mask 32, C mask 38, and D mask 46 selected in each case to produce desired effects in the wafer 60. In addition to or as alternatives to the four diffusion steps shown in FIG. 5, other processing operations on the elemental silicon exposed by the etching process may be carried out, such as epitaxial growth of silicon. Also, masks selected in accordance with the invention may be used to produce other types of patterns on the semiconductor wafer, such as aluminum conducting lines joining individual monolithic components in the circuits being produced. For further details on such monolithic integrated structure fabrication processes, reference is made to the above mentioned copending Agusta et al. application.

It should now be apparent that a process for producing integrated circuits on a semiconductor wafer or other patterns on a substrate utilizing sequential mask matching and capable of carrying out the stated objects of the invention has been provided. Matching the defect locations in the masks sequentially simplifies mask matching greatly by decreasing the number of comparisons that must be made to a small fraction of the total number of possible combinations of one mask from each level in the inventory. Sequential mask matching therefore allows the inventory of masks that may be compared on a practical basis to be increased. By allowing the selection of successive levels to be carried out only after the preceding levels have actually been used, the sequential mask matching process minimizes the time that masks must be removed from the available inventory. Finally, the process enables additional masks for later mask levels in a manufacturing run to be used in the selection process after the run has been started.

While the invention has been particularly shown and described with reference to preferred embodiments thereof, it will be understood by those skilled in the art that various changes in form and details may be made therein without departing from the spirit and scope of the invention.

What is claimed is:

1. A process for producing an array of integrated circuits on a semiconductor wafer using a plurality of masks in different levels to define a part of each integrated circuit in successive processing steps, the integrated circuits being subject to randomly occurring defects caused by random defects in the masks, comprising:

a. fabricating a number of masks for each level,
b. selecting a mask from a first level,
c. thereafter comparing masks from a second level with only the first level mask selected,
d. then selecting a combination of the first level mask and a second level mask which will maximize the number of defect-free integrated circuits produced in the array by use of the selected combination of masks, and
e. using a mask from the combination so selected for defining successively a part of each integrated circuit in a light-responsive pattern defining medium in each of said successive processing steps.

2. The process of claim 1 wherein the semiconductor substrate is a silicon wafer and the integrated circuits are essentially identical.

3. The process of claim 1 additionally comprising the steps of:

f. after selecting the combination of the first level mask and the second level mask, comparing the location of defects in masks from a third level with the location of defects in only the combination of the first and second level masks selected,
g. then selecting a third level mask to maximize the number of defect-free positions in the combination of first, second and third level masks, and
h. using the third level mask so selected in one of said successive processing steps for defining a part of each integrated circuit in a light-responsive pattern defining medium.

4. The process of claim 1 wherein the light-responsive pattern defining medium is photoresist.

5. A process for producing an array of integrated circuits on a semiconductor wafer using a plurality of masks in different levels to define a part of each integrated circuit in successive processing steps, the integrated circuits being subject to randomly occurring defects caused by random defects in the masks, comprising:

a. fabricating a number of masks for each level,
b. selecting a mask from a first level,
c. thereafter comparing the location of defects in masks from a second level with the location of defects in the first level mask selected,
d. then selecting a second level mask to maximize the number of defect-free positions produced by the combination of first and second level masks,
e. thereafter comparing the location of defects in masks from a third level with the location of defects in the combination of first and second level masks selected,
f. then selecting a third level mask to maximize the number of defect-free positions produced by the combination of first, second and third level masks, nd
g. using the combination of masks so selected for defining successively a portion of each integrated circuit in a light-responsive pattern defining medium in each of said successive processing steps.

6. The process of claim 5 wherein the semiconductor substrate is silicon and the integrated circuits in the array are essentially identical.

7. The process of claim 5 additionally comprising the steps of:

h. after selecting the third level masks, comparing the location of defects in masks for the remaining levels in the process with the location of the defects in masks for the levels already selected,
i. selecting masks for the remaining levels to maximize the number of defect-free positions produced by the combination of masks selected, and
j. using one of the selected masks for each of the remaining levels for defining successively a portion of each integrated circuit in a light-responsive pattern defining medium in each of the remaining levels in the process.

8. The process of claim 5 wherein the light-responsive pattern defining medium is photoresist.

9. A process for the manufacture of an array of monolithic integrated circuits on a semiconductor wafer using masks to define areas of the circuits in a plurality of successive processing steps, which comprises:

a. fabricating a set of masks for each processing step, the masks for each processing step having the same predetermined pattern,
b. inspecting the masks to determine the location of defects thereon,
c. recording the location of the defects in the masks,
d. then selecting one mask from a first set of masks for one of the processing steps,
e. thereafter comparing the defect locations of masks from a second set of masks for a different processing step with only the defect locations in the mask selected from the first set,
f. then selecting a mask from the second set which will minimize the number of additional defective integrated circuits in the array,
g. thereafter comparing the defect locations of masks from a third set of masks for another processing step with only the defect locations in the combination of masks selected from the first and second set,
h. then selecting a mask from the third set which will minimize the number of additional defective integrated circuits in the array when combined with the first and second masks selected, and
i. using the masks so selected, one for each successive processing step, to define successively an area of each circuit in a light-responsive pattern defining medium in each of the plurality of processing steps.

10. The process of claim 9 additionally comprising the steps of:

j. successively comparing the defect locations of masks for each remaining processing step with only the defect locations in masks for the processing steps already selected, k. selecting a mask for each remaining processing step which, on the basis of the comparison with the defect locations in masks for the processing steps already selected, will minimize the number of additional defective integrated circuits in the array produced by the selected mask for each remaining processing step, and l. using the masks for the remaining processing steps so selected, one for each processing step, to define successively an area of each circuit in a light-responsive pattern defining medium in each of the remaining processing steps.

11. A process for preparing an array of monolithic integrated circuits on a semiconductor wafer, using a plurality of masks in successive processing steps to define parts of the integrated circuits, the integrated circuits being subject to randomly occurring defects caused by random defects in the masks, comprising:

a. fabricating a number of masks for each processing step, b. inspecting each mask to determine which random positions in the array contain defects in the masks, c. recording the random defects for each mask on suitable recording medium, d. selecting one mask from a first set of masks each having the same predetermined pattern for one of the processing steps, e. coating the semiconductor wafer with a photoresist, f. using the selected mask from the first set to expose the photoresist, g. carrying out the remainder of a first processing step on the semiconductor wafer, h. thereafter comparing the defect locations of masks from a second set of masks each having the same predetermined pattern for a different processing step with the defect locations in the mask selected from the first set, i. then selecting a mask from the second set which will minimize the number of additional defective integrated circuits produced in array, j. coating the semiconductor wafer with photoresist a second time, k. using the mask selected from the second set to expose the photoresist, l. carrying out the remainder of a second processing step on the semiconductor wafer, m. thereafter comparing the defect locations of masks from a third set of masks each having the same predetermined pattern for another processing step with the defect locations in the combination of masks selected from the first and second set, n. then selecting a mask from the third set which will minimize the number of additional defective integrated circuits produced in the array when combined with the first and second masks selected, o. coating the semiconductor wafer with photoresist a third time, p. using the mask selected from the third set to expose the photoresist, q. carrying out the remainder of a third processing step on the semiconductor wafer, r. thereafter comparing the defect locations of a mask for each remaining processing step with the defect locations in the masks for the processing steps already selected, s. after comparing defect locations in the masks for each remaining processing step with the defect locations in masks already selected, selecting a mask for that remaining processing step which will minimize the number of additional defective integrated circuits in the array produced by the selected mask for that remaining processing step, and t. continuing the plurality of processing steps on the semiconductor wafer using each mask so selected to expose photoresist on the semiconductor wafer.

* * * * *